US005486446A

United States Patent [19]

Matushita et al.

[11] Patent Number: 5,486,446

[45] Date of Patent: Jan. 23, 1996

[54] MULTI-COLOR HEAT-SENSITIVE RECORDING MATERIAL UTILIZING MULTIPLE DIAZONIUM SALT LAYERS

[75] Inventors: Tetunori Matushita; Hiroshi Kamikawa; Hiroshi Satoh; Kimiatus Nomura; Mitsuyuki Tsurumi, all of Shizuoka, Japan

[73] Assignee: Fuji Photo Film Co., Ltd., Kanagawa, Japan

[21] Appl. No.: 257,055

[22] Filed: Jun. 8, 1994

[30] Foreign Application Priority Data

| | | | |
|---|---|---|---|
| Jun. 10, 1993 | [JP] | Japan | 5-138599 |
| Nov. 26, 1993 | [JP] | Japan | 5-297024 |

[51] Int. Cl.[6] .......... G03F 7/095

[52] U.S. Cl. .......... 430/156; 430/143; 430/157; 430/158; 430/162

[58] Field of Search .......... 430/143, 156, 430/157, 158, 162

[56] References Cited

U.S. PATENT DOCUMENTS 4,411,979 10/1983 Nagamoto et al. .......... 430/141

FOREIGN PATENT DOCUMENTS 459287 2/1992 Japan .
4201483 7/1992 Japan .

*Primary Examiner*—Charles L. Bowers, Jr.
*Assistant Examiner*—Christopher G. Young
*Attorney, Agent, or Firm*—Sughrue, Mion, Zinn, Macpeak & Seas

[57] ABSTRACT

A multi-color heat-sensitive recording material is disclosed which comprises a support having laminated thereon in the following order a first heat-sensitive color forming layer comprising mainly an electron donating dye precursor and an electron accepting compound, a second heat-sensitive color forming layer containing a diazonium salt compound having a maximum absorption wavelength of 360±20 nm and a coupler capable of reacting with the diazonium salt compound by heating to form color and a third heat-sensitive color forming layer containing a diazonium salt compound represented by formula (I) having a maximum absorption wavelength of 400±20 nm and a coupler represented by formula (II) capable of reacting with the diazonium salt compound by heating to form color:

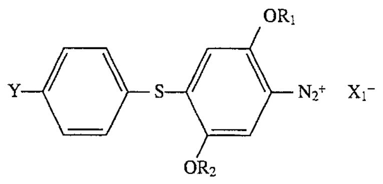

(I)

wherein $R_1$ and $R_2$ each represents an alkyl group, an aralkyl group or an aryl group; Y represents a halogen atom, an acyl group, an alkoxycarbonyl group or a sulfamoyl group; and $X_1^-$ represents a counter anion:

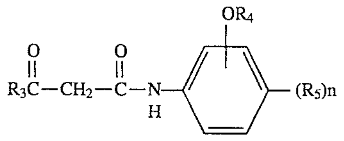

(II)

wherein $R_3$ represents an alkyl group or an aryl group; $R_4$ represents an alkyl group, an aryl group or an aralkyl group; $R_5$ represents an alkyl group, an alkoxy group, an aryloxy group, an aralkyloxy group, an alkylthio group, an arylthio group, an aralkylthio group or a halogen atom; and n represents 0 or an integer of 1 to 4.

4 Claims, 1 Drawing Sheet

MULTI-COLOR HEAT-SENSITIVE RECORDING MATERIAL UTILIZING MULTIPLE DIAZONIUM SALT LAYERS

FIELD OF THE INVENTION

This invention relates to a multi-color heat-sensitive recording material and, more particularly, to a multi-color heat-sensitive recording material capable of reproducing a full color image.

BACKGROUND OF THE INVENTION

Heat-sensitive recording can be conducted by simple recording devices, has high reliability and required little maintenance. Accordingly, heat-sensitive recording techniques have been continuously developed in recent years. Heat-sensitive recording can be adapted to various applications by utilizing the advantages thereof. However, it is considered that the reproduction of images by heat-sensitive recording is difficult as compared to electrophotography and ink jet recording. Conventional systems for obtaining a multi-color image by heat-sensitive recording include a thermal transfer system wherein a film coated with dyes is placed on an image receiving sheet, and the laminate is heated to transfer the dyes onto the sheet; and a sublimation transfer system. In these heat-sensitive recording systems, the recording devices are complicated because transfer sheets are used to transfer the dyes. Furthermore, at least three transfer sheets must be used to obtain one sheet of a full color image. Accordingly, the above-described recording systems cannot make the best use of the advantages of heat-sensitive recording and are disadvantageous in terms of cost. Attempts have long been made to heat directly the heat-sensitive recording materials to form colors; namely, to reproduce many colors by direct heat-sensitive recording.

JP-B-49-69 (the term "JP-B" as used herein means an "examined Japanese patent publication") proposed a heat-sensitive recording material Containing a plurality of electron donating dye precursors having different color formation initiating temperatures and a plurality of electron accepting compounds. Different temperatures are applied to thereby utilize the different color formation initiating temperatures of the dye precursors to obtain an image having various hues. Furthermore, JP-B-49-27708 and JP-B-51-5792 proposed a heat-sensitive recording material comprising two heat-sensitive color forming layers providing different hues in a laminated form, where the upper layer forms a color at a lower temperature, and both the upper layer and the lower layer form colors at a higher temperature to thereby form two colors. JP-B-51-5791 proposed a multi-color heat-sensitive recording material comprising a support having thereon a first heat-sensitive color forming layer containing a diazonium salt compound and a coupler, an interlayer containing a polyether compound and a second heat-sensitive color forming layer containing a basic dye precursor and an electron accepting compound in this order in a laminated form. In this arrangement, the second heat-sensitive color forming layer forms a color at a lower temperature, and the polyether compound erases the color of the second heat-sensitive color forming layer at a higher temperature. At the same time, the first heat-sensitive color forming layer forms a color, to thereby obtain a two-color image. The feature of JP-B-51-5791 resides in that the color of the second heat-sensitive color forming layer is erased during color formation of the first heat-sensitive color forming layer, to thereby obtain a color fraction having no color mixture.

JP-B-51-29024 proposed a two-color heat-sensitive recording material having two heat-sensitive color forming layers comprising basic dye precursors and electron accepting compounds in a laminated form, where guanidines (organic base compounds) are added to the lower color forming layer to erase the color of the lower-temperature color forming layer during color formation of the higher-temperature color forming layer. Furthermore, JP-B-51-37542-proposed a multi-color heat-sensitive recording material comprising a support having thereon a higher-temperature heat-sensitive color forming layer comprising an acid dye precursor and an organic base compound and a lower-temperature heat-sensitive color forming layer comprising a basic dye precursor and an electron accepting compound in a laminated form, where the organic base compound contained in the lower layer is diffused in the upper layer during high-temperature printing to thereby erase the developed color of the color former.

The above-described multi-color heat-sensitive recording materials are designed to reproduce two or more colors. However, even after considerable investigative effort, these systems are still ineffective in reproducing a full color image which has been in commercial demand in recent years.

As a method for reproducing a full color image by direct heat-sensitive recording, a heat-sensitive recording material is known comprising two heat-sensitive recording layers containing a combination of two kinds of diazonium salts having different light-sensitive wavelengths with couplers capable of reacting with the diazonium salts by heating to form different hues, and a heat-sensitive recording layer containing a combination of a basic dye precursor with an electron accepting compound in a laminated form of these layers, to thereby obtain a good multi-color image. This recording material comprises a support having laminated thereon a first heat-sensitive color forming layer comprising an electron donating dye precursor and an electron accepting compound, a second heat-sensitive color forming layer containing a diazonium salt compound having a maximum absorption wavelength of 360±20 nm and a coupler capable of reacting with the diazonium salt compound by heating to form a color, and a third heat-sensitive color forming layer containing a diazonium salt compound having a maximum absorption wavelength of 400±20 nm and a coupler capable of reacting with the diazonium salt compound by heating to form a color.

In a recording method using the above-described multi-color recording material, heat is first applied to third heat-sensitive recording layer 4 of FIG. 1 to form a color by reaction of the diazonium salt with the coupler contained in the same layer; the recording material is then irradiated with light of 400±20 nm to decompose the diazonium salt contained in the third heat-sensitive recording layer; and a sufficient amount of heat is applied to the recording material so that the recording of second heat-sensitive recording layer 3 of FIG. 1 can be conducted to form a color by reaction of the diazonium salt with the coupler contained in the same layer. In this case, high-intensity heat energy is applied to the third heat-sensitive recording layer. However, since the diazonium salt of the third layer is decomposed and loses color formability, no color is formed. Subsequently, the recording material is irradiated with light of 360±20 nm to decompose the diazonium salt contained in the second heat-sensitive recording layer, and a sufficient amount of heat is applied to the recording material so that the recording of first heat-sensitive recording layer 2 can be conducted to form a color. In this case, high-intensity heat energy is applied to the second and third heat-sensitive recording layers. However, since the diazonium salt in the second and third layers is decomposed and loses color formability, no color is formed.

In the above-described recording method, a full color image can be recorded when the compounds contained therein are selected so that the developed hues of the first, second and third heat-sensitive recording layers provide the primary three colors of yellow, magenta and cyan colors in a subtractive mixture, respectively.

The compounds used in the second and third heat-sensitive color forming layers include diazonium salt compounds, couplers capable of reacting with the diazonium salt compounds to form colors and basic materials capable of accelerating the reaction of the diazonium salt compounds with the couplers. These compounds are conventionally used in the field of diazo type copying paper and fixing type heat-sensitive recording papers using diazo compounds. Many compounds are conventionally known.

However, the recording materials containing diazo compounds have a disadvantages in that pre-coupling (a color reaction) gradually proceeds during storage before recording, and undesired coloring (fog) tends to occur. Various attempts have been made to solve the problem of coloring (fog). For example, JP-A-57-123086 (the term "JP-A" as used herein means an "unexamined published Japanese patent application") proposed to use any one of ingredients participating in the color reaction in the form of discontinuous particles (e.g., a solid dispersion) or separated as a separate layer to prevent the ingredients from being brought into contact with each other, to thereby prevent pre-coupling from proceeding. The preservability (raw preservability) of the recording materials is considerably improved by the above-described means. However, the thermal response property (fusibility by heat), which is an important performance criteria, tends to deteriorate. Furthermore, it is known that color forming components can be separated from one another by encapsulating one of the components in a non-polar waxy material (see, JP-A-57-44141, JP-A-57-142636) or a hydrophobic high-molecular (weight) material (see, JP-A-57-192944) to improve raw preservability as well as the thermal property.

In these encapsulating methods, the waxy materials or the high-molecular materials are dissolved in an appropriate solvent, and the color forming component is dissolved or dispersed in the resulting solution to form capsules. Accordingly, the capsules are different in conception from ordinary capsules where a core material is surrounded by a shell. When the color forming component is dissolved to form the capsules, a problem can arise in that the color forming component is not always processed into a core material and instead is uniformly mixed with the encapsulating material. Consequently, pre-coupling gradually proceeds at the interface between the shells of the capsules, and good raw preservability cannot be maintained. On the other hand, when the color forming component is dispersed to form the capsules, thermal response property is lowered since a color reaction does not take place when the shells of the capsules are not molten by heat. In addition thereto, the solvents used for dissolving the waxy materials or the high-molecular materials disadvantageously must be removed after the capsules are formed.

To solve these problems, a method has been proposed where at least one member of components which participate in the color reaction is contained in the core material, and the core material is surrounded with a shell formed by polymerization to thereby microencapsulate the member (see, JP-A-59-190886, JP-A-60-6493). When color recording is conducted after conventional heat-sensitive recording materials are stored under high temperature conditions for a long period of time, the image density thus obtained is often lower than that obtained before storage. Accordingly, there is a need in the art to improve storage stability. It is known that density of the developed color image is lowered when the diazo compounds contained in the color forming recording layer are decomposed by heat and, as a result, the amounts of the diazo compounds are reduced. It is also known that diazo compounds are generally unstable compounds. The stability of the diazo compounds depends on their crystal state and solution state. Conventional methods of increasing the thermal stability of diazo compounds include a method where solvated compounds are formed by water; a method where double salts are formed; a method where strong acid anions are used; and a method where acid compounds are added.

When high-purity diazo compounds are desired, a purification operation such as recrystallization is often conducted. In these cases, stabilization by solvation or the use of additives cannot be expected. In some cases, the diazo compounds are dissolved in organic solvents depending on the intended purpose, but the organic solvents are incapable of stabilizing the diazo compounds by solvation.

The thermal stability of the diazo compounds is necessarily increased for the above noted purpose. The method for increasing stability of the diazo compounds by adding an acid compound is not always effective when a base is present (in accordance with a preferred embodiment of this invention).

The present inventors have extensively studied on the thermal stability requirements of diazo compounds. As a result, the present inventors have discovered that compounds having a specific diazonium ion structure have excellent thermal stability.

Recording materials having excellent preservability before recording (hereinafter referred to as raw preservability) could be obtained by using the compounds disclosed in JP-A-1-80588.

However, the compounds disclosed in JP-A-1-80588 are disadvantageous in that sufficient fixing cannot be effected by light of 420±20 nm used for fixing (i.e., the operation where undesired diazonium compounds left behind after thermal recording are decomposed by light to deactivate the same) diazonium compounds contained in the third heat-sensitive recording layer.

To solve the above problem, the compounds disclosed in JP-A-4-59287 are developed. When these compounds are used, recording materials having excellent fixing properties and excellent raw preservability can be obtained. Furthermore, couplers capable of providing yellow dye images in combination with the compounds disclosed in JP-A-4-59287 are disclosed in JP-A-4-201483.

However, yellow dye images obtained from these combinations are disadvantageous in that fastness to light is poor. Furthermore, unfavorable coloring occurs after the diazonium salt compounds are decomposed by light.

SUMMARY OF THE INVENTION

Accordingly, an object of the present invention is to provide a multi-color heat-sensitive recording material which comprises color forming layers having high fastness to light and having a yellow color forming layer which is resistant to background staining after fixing by light.

Another object of the present invention is to provide a multi-color heat-sensitive recording material which is resistant to coloring after fixing by light and provides a developed color image having high fastness to light and a high color density.

The above noted objectives are achieved by a multi-color heat-sensitive recording material comprising a support having laminated thereon, in the following order, a first heat-sensitive color forming layer comprising mainly an electron donating dye precursor and an electron accepting compound, a second heat-sensitive color forming layer containing a first diazonium salt compound having a maximum absorption wavelength of 360±20 nm and a first coupler capable of reacting with the first diazonium salt compound by heating to form color and a third heat-sensitive color forming layer containing a second diazonium salt compound represented by general formula (I) having a maximum absorption wavelength of 400±20 nm and a-second coupler represented by general formula (II) capable of reacting with the second diazonium salt compound by heating to form color.

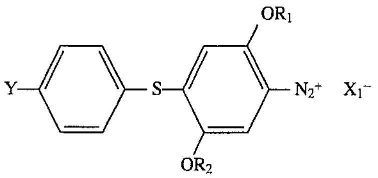
(I)

In general formula (I), $R_1$ and $R_2$, which may be the same or different and each represents a substituted or unsubstituted alkyl group, a substituted or unsubstituted aralkyl group or a substituted or unsubstituted aryl group; Y represents a halogen atom, an acyl group, an alkoxycarbonyl group or a sulfamoyl group; and $X_1^-$ represents a counter anion.

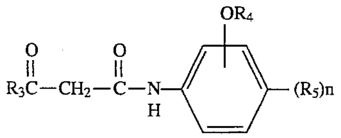
(II)

In general formula (II), $R_3$ represents a substituted or unsubstituted alkyl group or a substituted or unsubstituted aryl group; $R_4$ represents a substituted or unsubstituted alkyl group, a substituted or unsubstituted aryl group or a substituted or unsubstituted aralkyl group; $R_3$ represents a substituted or unsubstituted alkyl group, a substituted or unsubstituted alkoxy group, a substituted or unsubstituted aryloxy group, a substituted or unsubstituted aralkyloxy group, a substituted or unsubstituted alkylthio group, a substituted or unsubstituted arylthio group, a substituted or unsubstituted aralkylthio group or a halogen atom; and n represents 0 or an integer of 1 to 4, and when n is 2 or more, the two or more $R_5$ groups may be the same or different.

Further, the present inventors have discovered that when a diazonium salt compound represented by the following general formula (III) is used together with the diazonium salt compound of general formula (I), the color density can be further increased while performance of the diazonium salt compound of general formula (I) is maintained so that coloring after fixing by light is reduced and the developed color image has high fastness to light.

Accordingly, the present invention further provides a multi-color heat-sensitive recording material as described above, wherein the third heat-sensitive color forming layer further contains a diazonium salt compound represented by the following general formula (III) in combination with the diazonium salt compound of general formula (I) and the coupler of general formula (II).

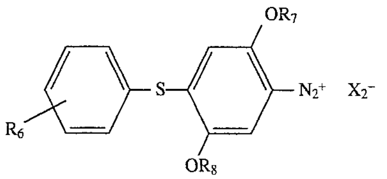
(III)

In general formula (III), $R_6$, $R_7$ and $R_8$, which may be the same or different, each represents a substituted or unsubstituted alkyl group, a substituted or unsubstituted aralkyl group or a substituted or unsubstituted aryl group; and $X_2^-$ represents a counter anion.

Furthermore, the present inventors have discovered that when a diazonium salt compound represented by the following general formula (IV), which is within the scope of the compound of general formula (I), is used together with a diazonium salt compound represented by the following general formula (V), which is within the scope of the compound of general formula (III), and a coupler represented by the following general formula (VI), which is within the scope of the coupler of general formula (II), is used in combination with the diazonium salt compounds of general formulae (IV) and (V) above, the fastness to light and the color density of the developed color image can be further increased.

Accordingly, the present invention further provides a multi-color heat-sensitive recording material as described above, wherein the second diazonium salt compound represented by general formula (I) is a diazonium salt compound represented by the following general formula (IV), the diazonium salt compound represented by general formula (III) is a diazonium salt compound represented by the following general formula (V), and the second coupler represented by general formula (II) is a coupler represented by the following general formula (VI).

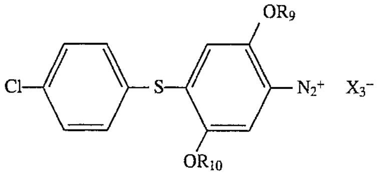
(IV)

In general formula (IV), $R_9$ and $R_{10}$, which may be the same or different, each represents a substituted or unsubstituted alkyl group; and $X_3^-$ represents a counter anion.

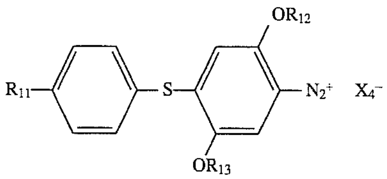
(V)

In general formula (V), $R_{11}$, $R_{12}$ and $R_{13}$, which may be the same or different, each represents a substituted or unsubstituted alkyl group; and $X_4^-$ represents a counter anion.

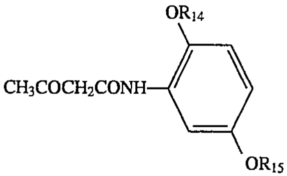

(VI)

In general formula (VI), $R_{14}$ and $R_{15}$, which may be the same or different, each represents a substituted or unsubstituted alkyl group.

Figure 1:
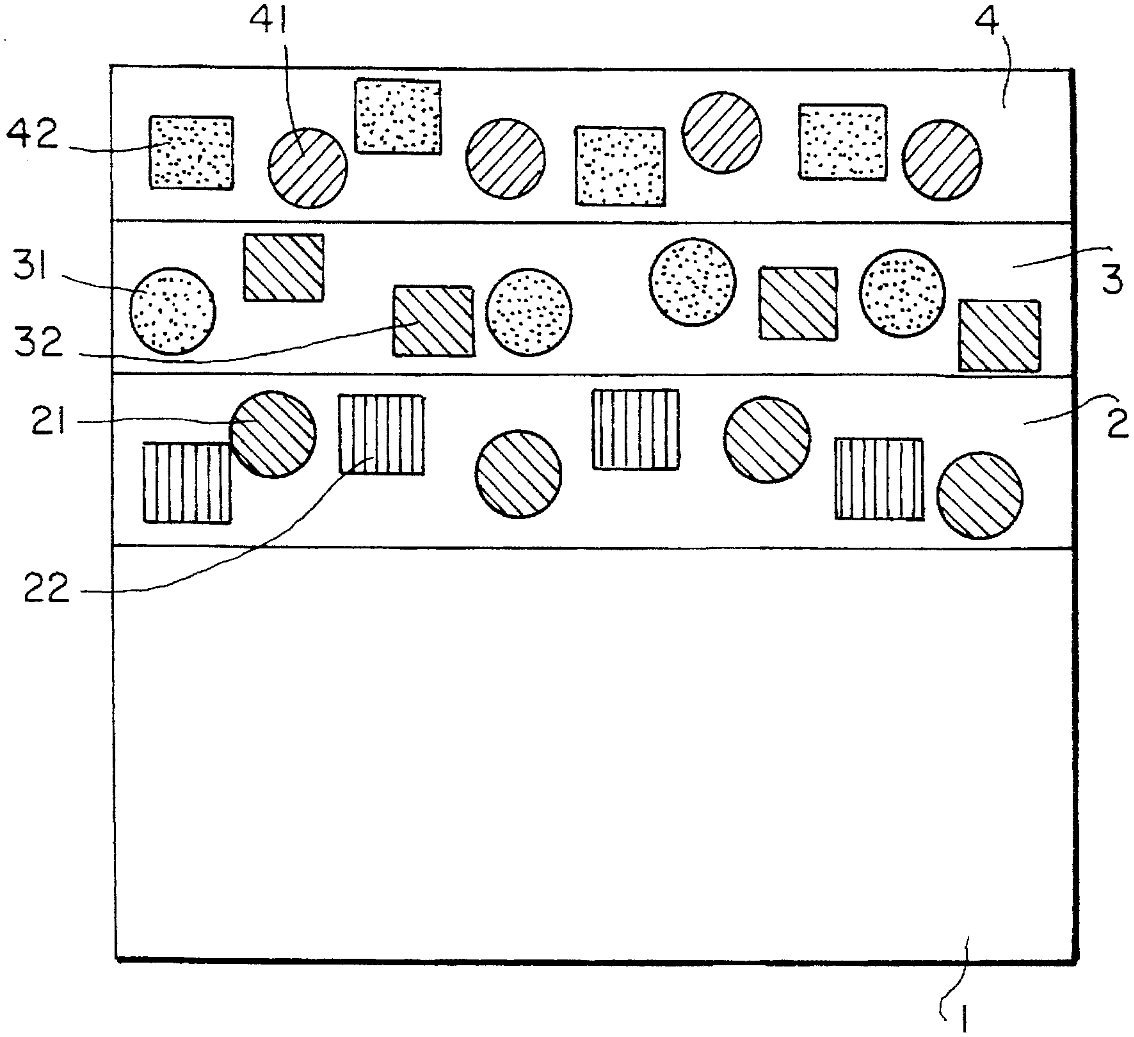
FIG. 1 is a schematic drawing illustrating an embodiment of a multi-color heat-sensitive recording material in accordance with the present invention.

The reference numbers of FIG. 1 represent the following members.

1. Support
2. First heat-sensitive color forming layer containing an electron donating dye precursor and an electron accepting compound.
3. Second heat-sensitive color forming layer containing a diazonium salt compound having a maximum absorption wavelength of 360±20 nm and a coupler.
4. Third heat-sensitive color forming layer containing a diazonium salt compound having a maximum absorption wavelength of 400±20 nm and a coupler.

21. Electron donating dye precursor

22. Electron accepting compound

31. Diazonium salt compound having a maximum absorption wavelength of 360±20 nm.

32. Coupler which reacts with diazonium salt compound 31 by heating to form a color.

41. Diazonium salt compound having a maximum absorption wavelength of 400±20 nm.

42. Coupler which reacts with diazonium salt compound 41 to form a color.

DETAILED DESCRIPTION OF THE INVENTION

Now, the present invention is illustrated in greater detail below.

In general formula (I), $R_1$ and $R_2$ each contains at least one carbon atom, preferably at least 6 carbon atoms, and more preferably at least 8 carbon atoms. However, the numbers of carbon atoms contained in $R_1$ and $R_2$ preferably do not exceed 24, respectively.

Examples of the unsubstituted alkyl group of $R_1$ and $R_2$ include a n-butyl group, a n-hexyl group, a n-octyl group and a 2-ethylhexyl group. Examples of the unsubstituted aralkyl group of $R_1$ and $R_2$ include a benzyl group and a phenethyl group. Examples of the unsubstituted aryl group of $R_1$ and $R_2$ include a phenyl group and a naphthyl group.

Preferred examples of the substituent groups for $R_1$ and $R_2$ include an alkyl group, an aryl group, a hydroxy group, an alkoxy group, an aryloxy group, an alkylthio group, an arylthio group, an acyl group, an alkoxycarbonyl group, an acyloxy group, a carbamoyl group, an acylamino group, a halogen atom and a cyano group.

Y is preferably a halogen atom. When Y contains carbon atoms, the numbers of the carbon atoms preferably do not exceed 24.

Examples of the counter anion represented by $X_1^-$ include $PF_6^-$, $BF_4^-$, $C_nF_{2n+1}COO^-$ (n: 3 to 9), $C_mF_{2m+1}SO_3^-$ (m: 2 to 8), $(ClF_{2l+1}SO_2)_2CH^-$ (l: 1 to 18),

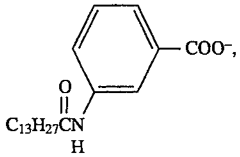

,

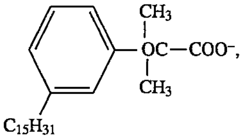

,

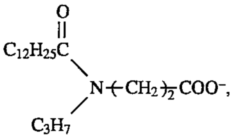

,

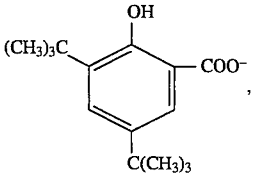

,

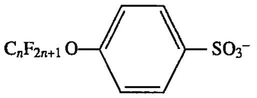

(n : 3–9),

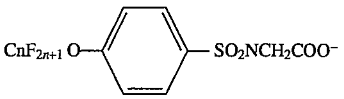

(n : 3–9), and

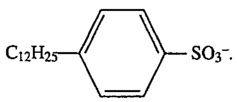

.

Preferably, $X_1^-$ is an acid anion containing a perfluoroalkyl group, a perfluoroalkenyl group, $PF_6^-$ or $BF_4^-$.

In general formula (II), the numbers of carbon atoms contained in $R_3$ preferably do not exceed 24 and are preferably within the range of 1 to 10. The sum total of carbon atoms of $R_4$ and $(R_5)_n$ are preferably at least 5, more preferably at least 8, and preferably within the range of 2 to 12, more preferably within the range of 4 to 10.

Examples of substituent groups for $R_3$, $R_4$ and $R_5$ include an alkyl group, an aryl group, an alkoxy group, a cyano group, a halogen atom, an ester group and an amide group.

In general formula (III), the numbers of carbon atoms contained in $R_6$, $R_7$ and $R_8$ are each preferably at least 6, and more preferably at least 8, and preferably do not exceed 24.

Examples of substituent groups for $R_6$, $R_7$ and $R_8$ include the same as those for $R_1$ and $R_2$ above.

Examples of the counter anion represented by $X_2^-$ include the same as those exemplified for $X_1^-$ above.

In general formula (IV), the numbers of carbon atoms contained in $R_9$ and $R_{10}$ are each preferably at least 6, and more preferably at least 8, and preferably do not exceed 24.

Examples of substituent groups for $R_9$ and $R_{10}$ include the same as those for $R_3$, $R_4$ and $R_5$ above.

Examples of the counter anion represented by $X_3^-$ include the same as those exemplified for $X_1^-$ above.

In general formula (V), the numbers of carbon atoms contained in $R_{11}$, $R_{12}$ and $R_{13}$ are each preferably at least 6, and more preferably at least 8, and preferably do not exceed 24.

Examples of substituent groups for $R_{11}$, $R_{12}$ and $R_{13}$ include the same as those for $R_3$, $R_4$ and $R_5$ above.

Examples of the counter anion represented by $X_4^-$ include the same as those exemplified for $X_1^-$ above.

In general formula (VI), when $R_{14}$ and $R_{15}$ are the unsubstituted alkyl group, the numbers of carbon atoms contained in $R_{14}$ and $R_{15}$ are each preferably in the range of 10 to 20, more preferably 12 to 16. When $R_{14}$ and $R_{15}$ have substituent groups, examples of the substituent groups include an aryl group, a hydroxy group, an alkoxy group, an aryloxy group, an alkylthio group, an arylthio group, an acyl group, an alkoxycarbonyl group, an acyloxy group, a carbamoyl group, an acylamino group, a cyano group and a halogen atom.

The diazonium salt compounds of general formulae (I), (III), (IV) and (V) preferably have a melting point of 30° to 200° C. Diazo compounds having a melting point of 50° to 150° C. are more preferred from the viewpoint of handling.

Furthermore, the diazonium salt compounds of the present invention preferably are microencapsulated to thereby prevent pre-coupling. When the diazonium salt compounds are microencapsulated, the diazonium salt compounds are dissolved in appropriate solvents (e.g., tricresyl phosphate). Accordingly, the diazonium salt compounds desirably have good solubility in these solvents. For this purpose, the solubility of the diazonium salt compounds represented by formulae (I), (III), (IV) and (V) of the present invention in the solvents is at least 5 wt %, and the solubility thereof in water is 1 wt % or below at a temperature of 15° to 25° C.

The diazonium salt compounds are used in an amount of preferably 0.02 to 3 g/m$^2$ in the heat-sensitive recording layer. From the standpoint of color density the diazonium salt compounds more preferably are used in an amount of 0.1 to 2 g/m$^2$ per recording layer.

When the diazonium salt compounds of general formulae (I) and (III) are used in combination in the same layer, the content of the compound of general formula (III) is preferably from 1 to 70 wt %, more preferably 5 to 40 wt %, that of the content of the compound of general formula (I).

Also, when the diazonium salt compounds of general formulae (IV) and (V) are used in combination in the same layer, the content of the compound of general formula (V) is preferably from 1 to 70 wt %, more preferably 5 to 40 wt %, that of the content of thee compound of general formula (IV).

The compounds of general formulae (II) and (VI) can be used in the form of an oily material or in a crystal state. The compounds are dissolved in appropriate solvents (e.g., tricresyl phosphate, dioctyl phthalate) and optionally low-boiling solvents (e,g., ethyl acetate) as co-solvents to obtain emulsions. Accordingly, it is desirable that the compounds have an appropriate solubility in these solvents.

The solubility of the compounds of general formulae (II) and (VI) in water is preferably 1 wt % or below at a temperature of 15° to 25° C. The compounds of general formula (II) or (VI) (the coupling components) are used in an amount of preferably 0.05 to 5 g/m$^2$ per recording layer in the heat-sensitive recording layer. From the standpoint of color density, the coupling components are more preferably used in an amount of 0.1 to 4 g/m$^2$ per recording layer.

The compounds of general formula (I) to (VI) are well known compounds and are easily synthesized by conventional methods as shown in, e.g., JP-A-4-2014837 and JP-A-4-59287.

Specific examples of the compounds for use in the present invention include, but are not limited to, the following compounds.

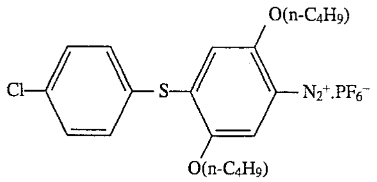
(I-1)

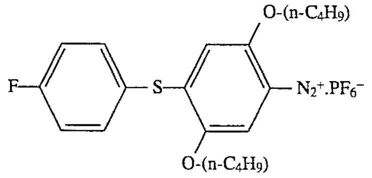
(I-2)

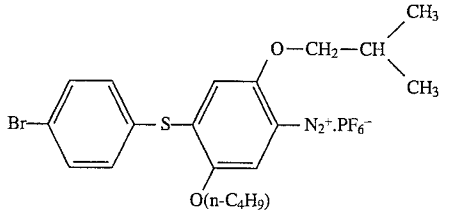
(I-3)

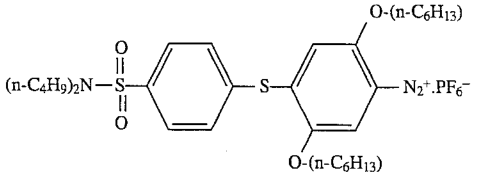
(I-4)

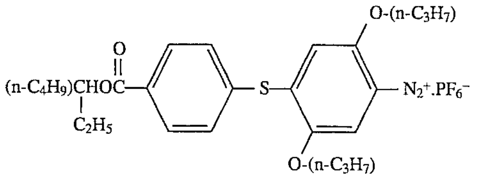
(I-5)

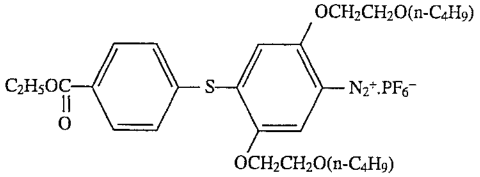
(I-6)

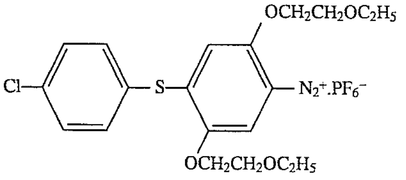
(I-7)

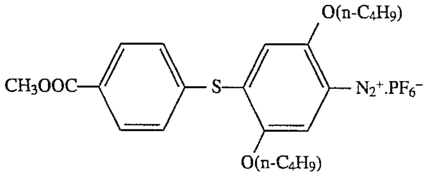
(I-8)

-continued
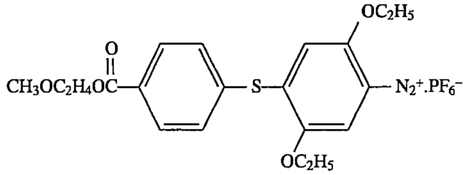
(I-9)
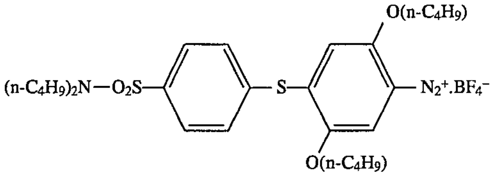
(I-10)
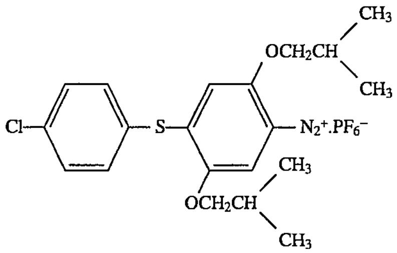
(I-11)
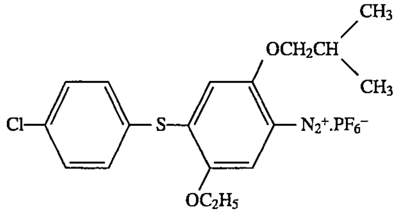
(I-12)
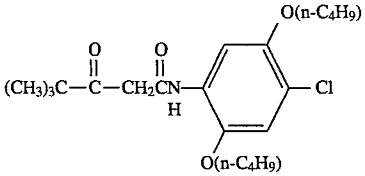
(II-1)
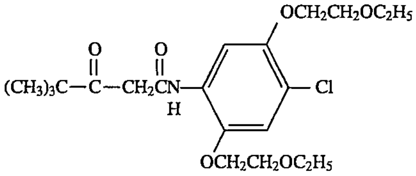
(II-2)
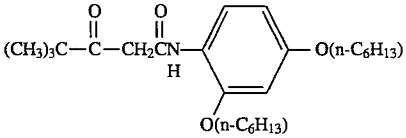
(II-3)
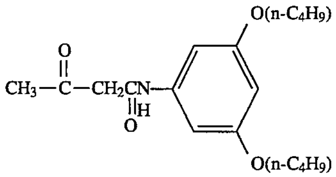
(II-4)
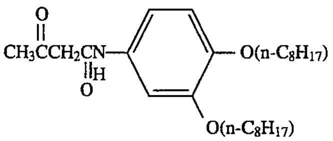
(II-5)
-continued
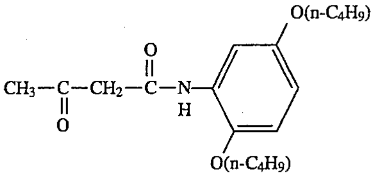
(II-6)
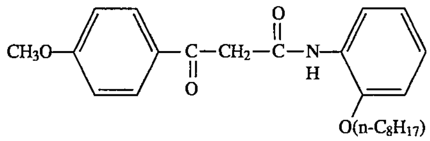
(II-7)
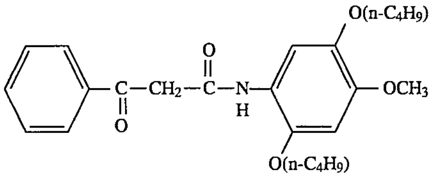
(II-8)
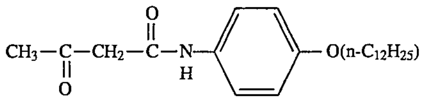
(II-9)
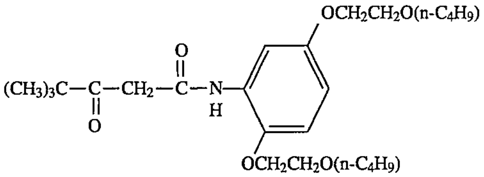
(II-10)
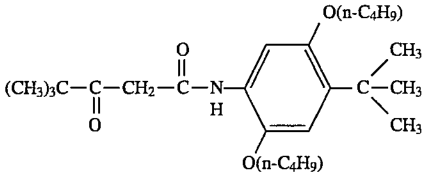
(II-11)
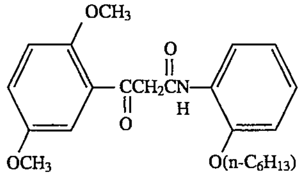
(II-12)
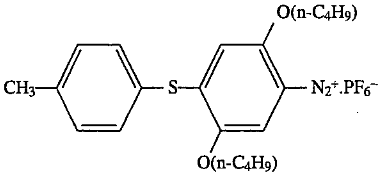
(III-1)
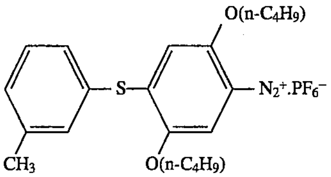
(III-2)

-continued
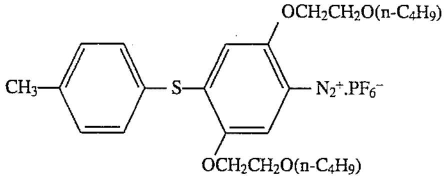
(III-3)
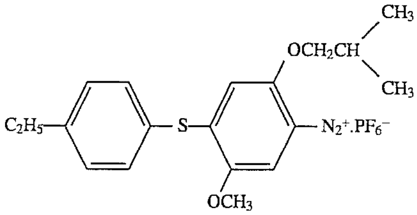
(III-4)
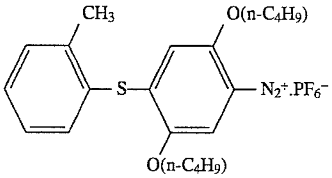
(III-5)
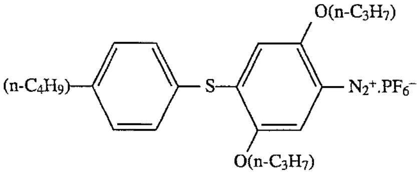
(III-6)
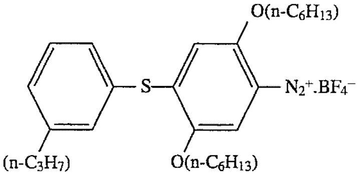
(III-7)
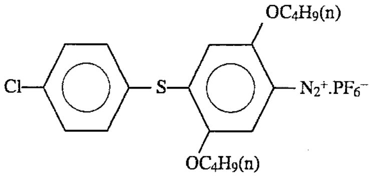
(IV-1)
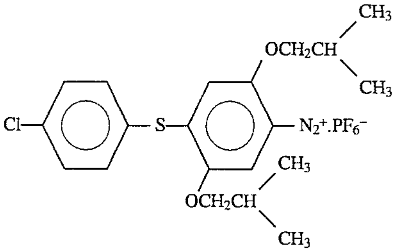
(IV-2)
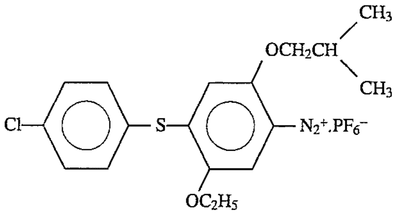
(IV-3)
-continued
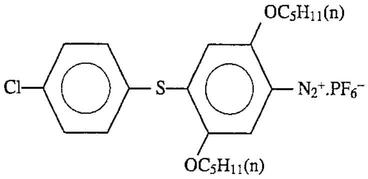
(IV-4)
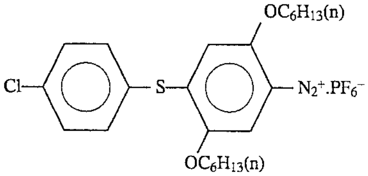
(IV-5)
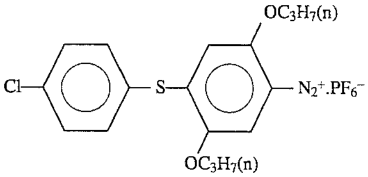
(IV-6)
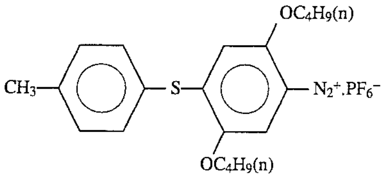
(V-1)
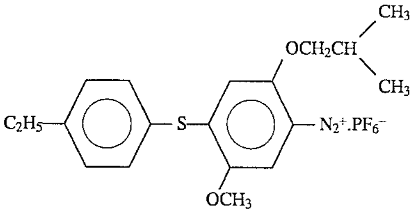
(V-2)
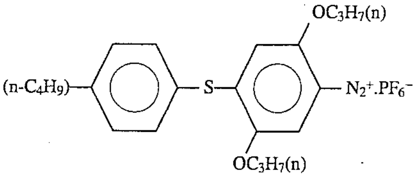
(V-3)
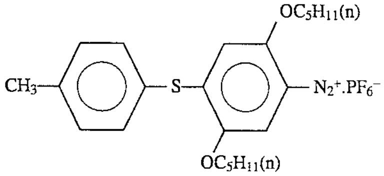
(V-4)
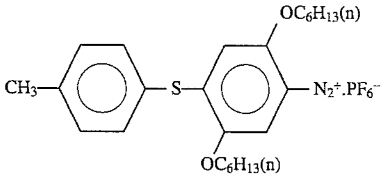
(V-5)
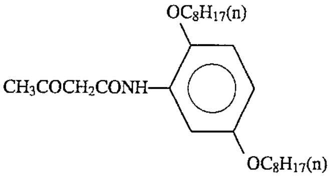
(VI-1)

-continued (VI-2)

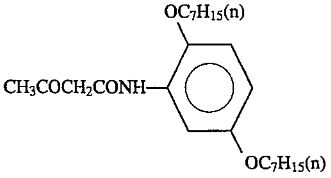

(VI-3)

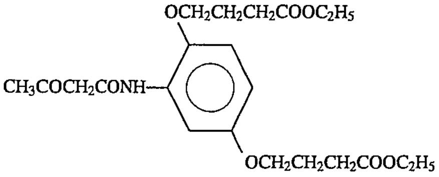

(VI-4)

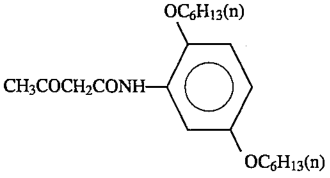

(VI-5)

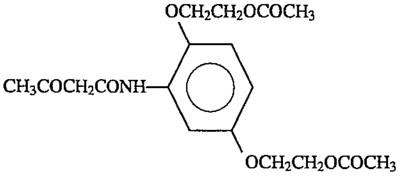

(VI-6)

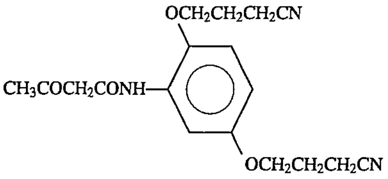

The above-described coupling components of the present invention may be used either alone or in a combination of two or more. The coupling components are preferably used in a combination of two or more to thereby prevent precipitation of the coupling components with time, and a stable, uniform heat-sensitive recording layer can thus be formed.

Materials for use in the present invention are illustrated below.

The materials contained in the first heat-sensitive color forming layer comprising mainly an electron donating dye precursor and an electron accepting compound include electron donating dye precursors, electron accepting compounds and low-melting organic compounds which facilitate the reaction of the electron donating dye precursor with the electron accepting compound by heating. These compounds are used in conventional pressure-sensitive recording papers and heat-sensitive recording papers. Many compounds are conventionally known.

The total amount of the electron donating dye precursor and the electron accepting compound is preferably 0.5 to 3.0 $g/m^2$, and the content of the low-melting organic compound is preferably 10 $g/m^2$ or less in the first heat-sensitive color forming layer.

Examples of useful electron donating dye precursors include triarylmethane compounds, diphenylmethane compounds, thiazine compounds, xanthene compounds and spiro-pyran compounds. Triarylmethane compounds and xanthene compounds are particularly useful because a high color density can be obtained. Specific examples of the electron donating dye precursors include 3,3-bis(p-dimethylaminophenyl)-6-dimethylaminophthalide (Crystal Violet Lactone), 3,3-bis(p-dimethylamino)phthalide, 3-(p-dimethylaminophenyl)-3-(1,3-dimethylindole-3-yl)phthalide, 3-(p-dimethylaminophenyl)-3-(2-methylindole-3-yl)phthalide, 3-(o-methyl-p-dimethylaminophenyl)-3-(2-methylindole-3-yl)phthalide, 4,4'-bis(dimethylamino)benzhydrinbenzyl ether, N-halophenyl Leucoauramine, N-2,4,5-trichlorophenyl Leucoauramine, Rhodamine B anilinolactam, Rhodamine (p-nitroanilino)lactam, Rhodamine B (p-chloroanilino)lactam, 2-benzylamino-6-diethylaminofluoran, 2-anilino-3-methyl-6-diethylaminofluoran, 2-anilino-3-methyl-6-cyclohexylmethylaminofluoran, 2-anilino-3-methyl-6-isoamylethylaminofluoran, 2-(o-chloroanilino)-6-diethylaminofluoran, 2-octylamino-6-diethylaminofluoran, 2-ethoxyethylamino-3-chloro-2-diethylaminofluoran, 2-anilino-3-chloro-6-diethylaminofluoran, benzoyl Leucomethylene Blue, p-nitrobenzyl Leucomethylene Blue, 3-methyl-spiro-dinaphthopyran, 3,3-dichloro-spiro-dinaphthopyran, 3-benzyl-spiro-dinaphthopyran and 3-propyl-spiro-dibenzopyran.

Examples of the electron accepting compounds include phenolic derivatives, salicylic acid derivatives and hydroxy benzoic esters. Particularly, bisphenols and hydroxybenzoic esters are preferred.

Specific examples of the electron accepting compounds include 2,2-bis(p-hydroxyphenyl)propane (bisphenol A), 2,2-bis(p-hydroxyphenyl)pentane, 2,2-bis(p-hydroxyphenyl)ethane, 2,2-bis(p-hydroxyphenyl)butane, 2,2-bis(4'-hydroxy-3',5'-dichlorophenyl)propane, 1,1-(p-hydroxyphenyl)cyclohexane, 1,1-(p-hydroxyphenyl)propane, 1,1-(p-hydroxyphenyl)pentane, 1,1-(p-hydroxyphenyl)-2-ethylhexane, 3,5-di(α-methylbenzyl)salicylic acid and polyvalent metal salts thereof, 3,5-di(tert-butyl)salicylic acid and polyvalent metal salts thereof, 3-α,α-dimethylbenzylsalicylic acid and polyvalent metal salts thereof, butyl p-hydroxybenzoate, benzyl p-hydroxybenzoate, 2-ethylhexyl p-hydroxybenzoate, p-phenylphenol and p-cumylphenol. As the metals for the polyvalent metal salts, Ni, Ca and Zn can be used.

Low-melting organic compounds having appropriately an aromatic group and a polar group in the molecule are preferred as sensitizing agents. Specific examples of useful organic compounds include benzyl p-benzyloxybenzoate, α-naphthylbenzyl ether, β-naphthylbenzyl ether, phenyl β-naphthoate, phenyl α-hydroxy-β-naphthoate, β-naphthol(p-chlorobenzyl) ether, 1,4-butanediol phenyl ether, 1,4-butanediol p-methylphenyl ether, 1,4-butanediol p-ethylphenyl ether, 1,4-butanediol-m-methylphenyl ether, 1-phenoxy-2-(p-tolyloxy)ethane, 1-phenoxy-2-(p-ethylphenoxy)ethane, 1-phenoxy-2-(p-chlorophenoxy)ethane and p-benzylbiphenyl.

The compounds contained in the second heat-sensitive color forming layer containing a diazonium salt compound and a coupler capable of reacting with the diazonium salt compound by heating to form color include diazonium salt compounds (first diazonium salt compounds), couplers (first couplers) capable of reacting with the first diazonium salt compounds to form color and basic materials capable of accelerating the reaction of the diazonium salt compounds with the couplers. These compounds are conventionally used in diazo copying papers and fixing type heat-sensitive recording papers. Many compounds are conventionally known.

The total amount of the diazonium salt compound and the coupler contained in the second heat-sensitive color forming layer is preferably 0.5 to 3.0 $g/m^2$. The content of the basic material is preferably 5 to 300 wt % that of the content of the coupler in the second heat-sensitive color forming layer.

Specific examples of useful diazonium salt compounds having a maximum absorption wavelength of 360±20 nm as the first diazonium salt compounds include 4-{N-[2-(2,4-ditertamylphenoxy)butyryl]piperazino}benzenediazonium, 4-dioctylaminobenzenediazonium, 4-[N-(2-ethylhexanoyl)piperazino]benzenediazonium, 4-dihexylamino-2-hexyloxybenzenediazonium, 4-N-ethyl-N-hexadecylamino-2-ethoxybenzenediazonium and 3-chloro-4-dioctylamino-2-octyloxybenzenediazonium. The hexafluorophosphate salts, tetrafluoroborate salts and 1,5-naphthalenesulfonate salts thereof are useful in the present invention because the solubility thereof in water is low.

Specific examples of couplers capable of reacting with the first diazonium salt compounds having a maximum absorption wavelength of 360±20 nm by heating to form color for use in the present invention include the following compounds.

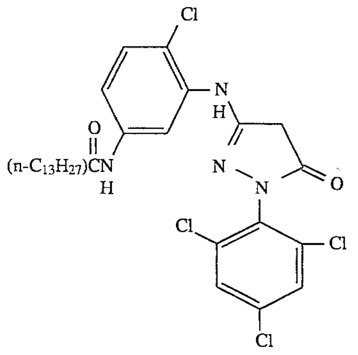

(A)

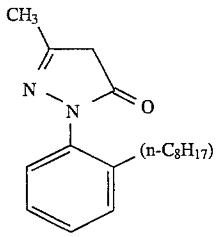

(B)

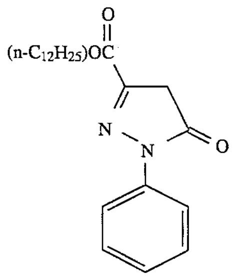

(C)

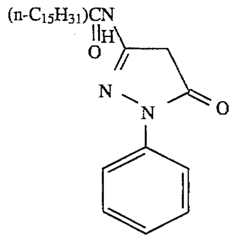

(D)

-continued

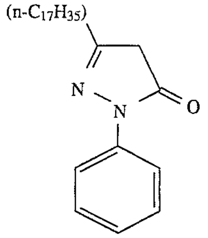

(E)

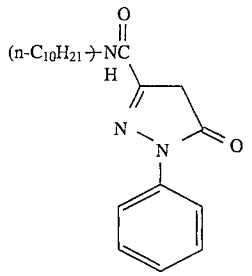

(F)

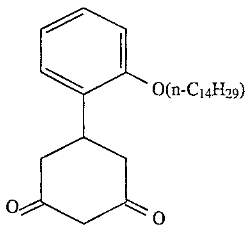

(G)

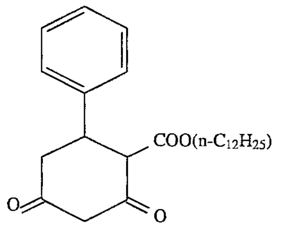

(H)

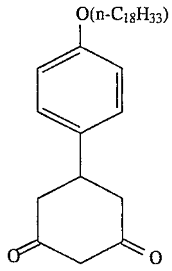

(I)

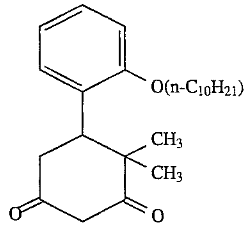

(J)

The couplers may be used in a combination of two or more to obtain a desired hue.

Useful basic materials include inorganic and organic base compounds and compounds which are decomposed by heating to release an alkaline material. Typical examples of the basic materials include nitrogen-containing compounds such as organic ammonium salts, organic amines, amides, urea, thiourea and derivatives thereof, thiazoles, pyrroles, pyrimidines, piperazines, guanidines, indoles, imidazoles, imidazolines, triazoles, morpholines, piperidines, amidines, formamidines and pyridines. Specific examples thereof include tricyclohexylamine, tribenzylamines, octadecylbenzylamine, stearylamine, allylurea, thiourea, methylthiourea, allylthiourea, ethylenethiourea, 2-benzylimidazole, 4-phenylimidazole, 2-phenyl-4methylimidazole, 2-undecylimidazoline, 2,4,5-trifuryl-2imidazoline, 1,2-diphenyl-4,4-dimethyl-2-imidazoline, 2-phenyl-2-imidazoline, 1,2,3-triphenylguanidine, 1,2-dicyclohexylguanidine, 1,2,3-tricyclohexylguanidine, guanidine trichloroacetate, N,N'-dibenzylpiperazine, 4,4'-dithiomorpholine, morpholinium trichloroacetate, 2-aminobenzothiazole and 2-benzoylhydrazinobenzothiazole. These compounds may be used in a combination of two or more.

Materials for use in an interlayer of the present invention are emulsions or latexes of water-soluble high-molecular materials or hydrophobic high-molecular materials. The interlayer is present between the first heat-sensitive color forming layer and the second heat-sensitive color forming layer or between the second heat-sensitive color forming layer and the third heat-sensitive color forming layer.

The coated amount of the interlayer is preferably 0.01 to 25 $g/m^2$.

Examples of the water-soluble high-molecular materials include polyvinyl alcohol, silanol-modified polyvinyl alcohol, carboxy-modified polyvinyl alcohol, styrene-maleic anhydride copolymer and esters thereof, butadiene-maleic anhydride copolymer, ethylene-maleic anhydride copolymer, isobutylene-maleic anhydride copolymer, polyacrylamide, polystyrenesulfonic acid, polyvinyl pyrrolidone, ethylene-acrylic acid copolymer, vinyl acetateacrylic acid copolymer, oxidized starch, phosphated starch, gelatin, carboxymethyl cellulose, methyl cellulose, sodium alginate, cellulose sulfate and hydroxyethyl cellulose. Examples of the emulsions or latexes of the hydrophobic high-molecular materials include the emulsions or latexes of styrene-butadiene copolymer, carboxy-modified styrene-butadiene copolymer and acrylonitrile-butadiene copolymer.

The preparation of the multi-color heat-sensitive recording material of the present invention is illustrated below.

Each of the color forming components used in all heat-sensitive recording layers of the multi-color heat-sensitive recording material of the present invention is uniformly dispersed in a binder (e.g., a water-soluble high-molecular material) and incorporated into each heat-sensitive recording layer so as to prevent the color forming components from coming into contact with one another. Namely, the electron donating dye precursor and the electron accepting compound are contained in the first heat-sensitive recording layer so as to prevent these color forming components from coming into contact with one another. The diazonium salt compound and the coupler are contained in each of the second and third heat-sensitive recording layers so as to prevent these color forming components from coming into contact with one another. Conventional methods thereof include a method where each component is separately dispersed in an aqueous solution of a water-soluble high-molecular material, the water-soluble high-molecular material is sufficiently adsorbed by the surface of each component, and the color forming components are mixed with each other; a method where at least one of the color forming components is microencapsulated; and a method where the reactive components are separated from each other and are separately formulated into a two-layer structure.

As the water-soluble high-molecular material for use in the heat-sensitive recording layers, the materials for use in the interlayer described above can also be used. The solid content of the water-soluble high-molecular material in the first and the second heat-sensitive recording layers is preferably 0.1 to 5 $g/m^2$, respectively.

The case where the color forming components are the electron donating dye precursor and the electron accepting compound is illustrated below. However, it should be understood that the diazonium salt compound and the coupler can be introduced into the heat-sensitive recording layer in the same manner as described below.

In the method where each component is separately dispersed in an aqueous solution of a water-soluble high-molecular material, the water-soluble high-molecular material is sufficiently adsorbed on the surface of each component, and the color forming components are mixed-with each other. The electron donating dye precursor (e.g., Crystal Violet Lactone) is introduced into an aqueous solution of a water-soluble high-molecular material (e.g., polyvinyl alcohol) and dispersed, for example, by using a ball mill. The crystal of the electron donating dye precursor is thus pulverized into fine particles and, at the same time, the water-soluble high molecular material is adsorbed on the surface of the crystal, to thereby obtain a dispersion of fine particles of the electron donating dye precursor protected by the adsorption layer of the water-soluble high-molecular material. In the same manner as described above, a dispersion of fine particles of an electron accepting compound (e.g., bisphenol A) can be obtained. When both dispersions are mixed with each other, a color reaction does not take place because the dispersions are protected by the respective adsorption layers. The mixed solution thereof is coated on a support to obtain a recording material. When the recording material is heated, at least one component is molten, the adsorption layer is broken, and the components react to thereby form a color image. Water-soluble high-molecular materials described above in the preparation of the interlayer of the present invention can be used. However, polyvinyl alcohol and derivatives thereof, polyacrylamide and copolymers thereof, hydroxyethyl cellulose and starch derivatives are particularly preferred.

In the method wherein at least one of the color forming components is microencapsulated, the electron donating dye precursor and/or the electron accepting compound are/is microencapsulated by any of conventional methods. The shell of the microcapsule used in the present invention must have such properties that the material within the capsule is completely isolated from the material of the capsule nucleus at ordinary storage and handling temperatures and, at the same time, the permeability of the shell is increased during heating to accelerate the reaction between both compounds. Namely, the microcapsule must be a heat responsive type. Examples of materials used for the shell of the capsule include gelatin, polyurea, polyurethane, polyimides, polyesters, polycarbonates and melamine. However, polyurea and polyurethane are preferred as the shell of the heat responsive microcapsule. The capsule shell desirably has a glass transition point of not lower than room temperature, but not higher than 200° C., particularly preferably 70° to 150° C. to impart a heat responsive property to the capsule shell.

The glass transition point of the capsule shell can be controlled by choosing an appropriate polymer for the capsule shell or adding an appropriate plasticizer. Examples of the auxiliary agent include phenolic compounds, alcohol compounds, amide compounds and sulfonamide compounds. These compounds may be contained in the core material of the capsule, or may be added as a dispersion to-the outer surface of the capsule.

The microencapsulizatian of the dye precursor is illustrated below. However, other materials can be micro-encapsulized in the same manner as described below. Specific examples of microencapsulization and materials and compounds for use in the microencapsulization are described in U.S. Pat. Nos. 3,726,804 and 3,796,696.

For example, when polyurethane or polyurea is used as a material for the capsule shell, a polyisocyanate and a second material (e.g., a polyol or a polyamine) capable of reacting with the polyisocyanate to form the capsule shell are mixed with a water phase or an oily liquid to be capsulated and the mixture is emulsified and dispersed in water. The temperature is then raised to allow a high-molecular material forming reaction to take place at the interface between oil droplets, to thereby form a microcapsule shell. The glass transition point of the capsule shell can be greatly varied by appropriately choosing the polyisocyanate (the first shell membrane forming material) and the polyol or the polyamine (the second shell membrane forming material).

High-boiling oils (B.P.: higher than 120° C.) can be used as organic solvents for preparing the core of the capsule. Specific examples of the oils include phosphoric esters, phthalic esters, acrylic esters, methacrylic esters, other carboxylic acid esters, fatty acid esters, fatty acid amides, alkylated biphenyls, alkylated terphenyls, alkylated naphthalenes, diarylethanes and chlorinated paraffins. Low-boiling co-solvents (B.P.: 120° C. or lower) may be used to facilitate dissolution of the electron donating dye precursor. Specific examples of the co-solvents include ethyl acetate, isopropyl acetate, butyl acetate, methylene chloride and cyclohexanone.

Protective colloid or surfactants can be added to the water phase to stabilize the emulsified oil droplets. Generally, water-soluble high-molecular materials can be used as protective colloids. Specific examples thereof include polyvinyl alcohol, modified polyvinyl alcohol, methyl cellulose, polysodium styrenesulfonate and ethylene/maleic acid copolymers. From the standpoint of improving resolution of the image and handling, the microcapsule preferably has a volume-average size of not larger than 20 μm, but not smaller than 0.3 μm, more preferably not greater than 4 μm, but not smaller than 0.5 μm.

Generally, the components are more effectively separated from one another by using a microcapsule shell rather than by an adsorption layer of a water-soluble high-molecular material. Namely, microencapsulation effectively inhibits the materials from reacting with one another. For example, when the electron donating dye precursor is microencapsulated, the electron accepting compound in the form of fine particles is simply formulated into a dispersion and mixed with the capsule solution. Alternatively, the electron accepting compound is dissolved in a high-boiling solvent and then emulsified in an aqueous solution of a water-soluble high-molecular material, and the resulting emulsion may be mixed with the capsule solution. This has an advantage in that when the mixture is coated on a support and dried, a transparent heat-sensitive recording layer can be obtained. When a transparent support such as a plastic base is used, a more transparent heat-sensitive recording material can be obtained.

The thus obtained coating solutions for the recording layers are coated in order on a support, to thereby obtain a multi-color heat-sensitive recording material of the present invention. Conventional supports such as paper, laminated paper (e.g., polyethylene-laminated paper), synthetic paper and plastic bases (e.g., polyethylene terephthalate, polyimides, triacetyl cellulose) can be used. The coating solution can be coated on the support by conventional methods such as air knife coating, curtain coating, slide coating, roller coating, dip coating, wire bar coating, blade coating, gravure coating, spin coating and extrusion coating.

The recording procedure of the multi-color heat-sensitive recording material of the present invention is illustrated below.

First, heat energy capable Of conducting recording is applied to the third heat-sensitive color forming layer containing a second diazonium salt compound having a maximum absorption wavelength of 400±20 nm and a second coupler capable of reacting with the second diazonium salt compound by heating to form color, to thereby obtain a color image. Subsequently, the recording material is exposed to light using an ultraviolet lamp of 400±20 nm. Heat energy capable of conducting recording is then applied to the second heat-sensitive color forming layer containing a first diazonium salt compound having a maximum absorption wavelength of 360±20 nm and a first coupler capable of reacting with the first diazonium salt compound by heating to form color, to thereby conduct recording and obtain a color image of the second heat-sensitive color forming layer. In this case, heat is also applied to the third heat-sensitive color forming layer, but the diazonium salt compound which is a color forming component was previously decomposed by exposure to light of 400±20 nm, and hence no color reaction takes place. Subsequently, the recording material is exposed to light using an ultraviolet lamp of 360±20 nm to deactivate the second heat-sensitive color forming layer. Finally, heat energy capable of conducting recording is applied to the first heat-sensitive color forming layer to record on the first recording layer.

When the reactive components are selected so that the first recording layer is a cyan color forming layer, the second recording layer is a magenta color forming layer, and the third recording layer is a yellow color forming layer, each of the three primary colors in the subtractive mixture can be recorded to thereby provide a full color image. In the above recording procedure, decomposition of the diazonium salt compound by light is carried out by using an ultraviolet lamp. The ultraviolet lamp is a fluorescent-tube filled with mercury vapor. Fluorescent tubes having various light emitting wavelengths can be obtained depending on the types of phosphor coated on the inner wall of the tube. In the ultraviolet lamp for use in the present invention particularly the lamp which is intended to decompose the diazonium salt compound contained in the third heat-sensitive recording layer, it is necessary that the light emitting wavelength range of the ultraviolet lamp is as sharp (i.e., narrow) as possible. Namely, when the light emitting wavelength range is broad, the diazonium salt compound contained in the second heat-sensitive recording layer is decomposed by exposure to light. The phosphors having a sharp light emitting wavelength band are limited to specific types, and examples of conventional phosphors having a sharp light emitting wavelength band in the ultraviolet ray region include the following compounds.

$Sr_2P_2O_7$: $Eu^{2+}$ (420 nm), $Sr_2(PO_4)_2$: $Eu^{2+}$ (402 nm), $(SrMg)_2P_2O_7$: $Eu^{2+}$ (402 nm), $SrB_4O_7F$: $Eu^{2+}$ (367 nm), $SrB_4O_7F$: $Eu^{2+}$ (356 nm)

Note: The parenthesized part represents the light emitting central wavelength. The half width is about 20 nm. Namely, most of the phosphors for ultraviolet lamps which meet the demand of the present invention have a light emitting central wavelength in the vicinity of 400 nm and 360 nm. These phosphors are excellent in industrial productivity and have high fastness. The wavelengths of light for-use in decomposition of the diazonium salt compounds contained in the second and third heat-sensitive recording layers are compatible with the central wavelengths of the above phosphors. Accordingly, recording systems can be inexpensively prepared.

The present invention is now illustrated in greater detail by reference to the following Examples which, however, is not to be construed as limiting the invention in any way. All "parts" given in the following example are by weight, unless otherwise stated.

EXAMPLES (1) Synthesis of 4-(p-chlorophenylthio)-2,5-dibutoxybenzenediazonium hexafluorophosphate (compound I-1)

(i) To 110 parts of methanol was added 51 parts of 2,5-dibutoxy-4-chloronitrobenzene. The mixture was heated to 50° C. A methanol (50 parts) solution of 25 parts of p-chlorobenzenethiol and 9.8 parts of sodium methylate was added dropwise thereto over a period of about one hour to carry out a reaction. After completion of the dropwise addition, the reaction was further continued under reflux for 5 hours. After completion of the reaction, 85 parts of water were added to the reaction mixture to precipitate a crystal. The resulting crystal was recovered by filtration and recrystallized from methanol to obtain 59 parts of 4-chlorophenylthio-2,5-dibutoxynitrobenzene having a m.p. of 74° to 75° C.

(ii) To a mixture of 58 parts of reduced iron, 5.8 parts of ammonium chloride, 25 parts of water and 150 parts of isopropanol was gradually added 58 parts of 4-chlorophenylthio-2,5-dibutoxynitrobenzene under reflux to reduce the nitro compound. Post-treatment was carried out in a conventional manner known to these of ordinary skill to obtain 54 parts of 4-tolylthio-2,5-dibutoxyaniline.

(iii) To methanol (600 parts) containing 100 parts of concentrated hydrochloric acid was added 54 parts of 4-chlorophenylthio-2,5-dibutoxyaniline, and the entire mixture was cooled to −10° C. A solution of 10.5 parts of sodium nitrite and 17 parts of water was added dropwise thereto with care so that the internal temperature did not exceed 0° C. to carry out diazotization.

Subsequently, 30 parts of $KPF_6$ was added. After the internal temperature was raised to 25° to 30° C., 70 parts of water was added thereto.

After the addition of water, the mixture was cooled with ice water to precipitate a crystal. The resulting crystal was recovered by filtration.

The crystal was recrystallized from a mixed solution of ethyl acetate and methanol to obtain 62 parts of 4-chlorophenylthio-2,5-dibutoxybenzenediazonium hexafluorophosphate. Melting Point: 119° to 120° C.

(2) Synthesis of 4,4-dimethyl-3-oxopentanoic acid-2',5'-di-n-butoxy-4'-chloroanilide (compound II-1)

(i) To a mixture of 84 parts of reduced iron, 8 parts of ammonium chloride, 35 parts of water and 160 parts of isopropanol was gradually added 60.3 parts of 2,5-dibutoxy-4-chloronitrobenzene under reflux to reduce the nitro compound. Post-treatment was carried out in a conventional manner to obtain 53 parts of 2,5-dibutoxy-4-chloroaniline (m.p.: 43° to 44° C.).

(ii) A mixture of 52 parts of 2,5-dibutoxy-4-chloroaniline and 65.4 parts of ethyl pivaloylacetate was heated to 150° to 160° C. (external temperature), and ethanol formed therein was removed. When the formation of ethanol was completed, excess ethyl pivaloylacetate was distilled off under reduced pressure. After cooling, 50 parts of isopropanol and 150 parts of n-hexane were added thereto, and the precipitated crystal was recovered by filtration to obtain 59 parts of 4,4-dimethyl-3-oxopentanoic acid-2',5'-di-n-butoxy-4'-chloroanilide (m.p.: 65° to 67° C.).

(3) Synthesis of 4-tolylthio-2,5-dibutoxybenzenediazonium hexafluorophosphate (compound III-1)

(i) To 110 parts of methanol was added 51 parts of 2,5-dibutoxy-4-chloronitrobenzene, and the mixture was warmed to 50° C. A methanol (50 parts) solution of 21.5 parts of p-thiocresol and 9.8 parts of sodium methylate was added dropwise thereto over a period of about one hour to carry out a reaction therebetween. After completion of the dropwise addition, the reaction was further continued under reflux for 5 hours. After completion of the reaction, 85 parts of water was added to the reaction mixture to precipitate a crystal. The crystal was recovered by filtration and recrystallized from methanol to obtain 58.5 parts of 4-tolylthio-2,5-dibutoxynitrobenzene (m.p.: 44° to 45° C.).

(ii) To a mixture of 56 parts of reduced iron, 5.4 parts of ammonium chloride, 25 parts of water and 150 parts of isopropanol was gradually added 58.5 parts of 4-tolylthio-2,5-dibutoxynitrobenzene under reflux to reduce the nitro compound. Post-treatment was carried out in a conventional manner to obtain 53 parts of 4-tolylthio-2,5-dibutoxyaniline.

(iii) To a methanol (600 parts) solution containing 100 parts of concentrated hydrochloric acid was added 53 parts of 4-tolylthio-2,5-dibutoxyaniline, and the entire mixture was cooled to −10° C.

A solution of 10.3 parts of sodium nitrite and 17 parts of water was added dropwise thereto with care so that the internal temperature did not exceed 0° C. to carry out diazotization.

Subsequently, 30 parts of $KPF_6$ was added thereto. The internal temperature of the reaction mixture (solution) was raised to 25° to 30° C., and 70 parts of water was added thereto.

After the addition of water, the reaction mixture was cooled with ice water to precipitate a crystal. The crystal was recovered by filtration and recrystallized from a mixture of ethyl acetate and methanol to obtain 68 parts of 4-tolylthio-2,5-dibutoxybenzenediazonium hexafluorophosphate (m.p.: 114° to 116° C.).

(4) Preparation of Heat-Sensitive Recording material (I)

(i) Preparation of Sample 101 (Comparative Example)

(Preparation of Capsule Solution of Diazonium salt Compound)

3.0 parts of 2,5-dibutoxy-4-tolylthiobenzenediazonium hexafluorophosphate (III-1) as the diazonium salt compound were dissolved in 20 parts of ethyl acetate.

Further, 20 parts of a lower-alkylnaphthalene (high-boiling solvent) was added thereto. The mixture was heated to uniformly mix the same.

To the resulting solution was added 15 parts of an adduct of xylylene diisocyanate/trimethylolpropane as the material for the capsule shell. The mixture was uniformly stirred.

Separately, 54 parts of a 6 wt % aqueous solution of polyvinyl alcohol (degree of polymerization: 1,700; degree of saponification: 88%) was prepared and added to the above diazonium salt compound solution. The mixture was emulsified and dispersed in a homogenizer.

To the resulting emulsion was added 68 parts of water, and the mixture was uniformly mixed. The temperature of the mixture was raised to 40° C. while stirring, and an encapsulization reaction was carried out for 3 hours to obtain the desired capsule solution. The resulting capsules had an average particle size of 1.0 μm.

Preparation of Coupler Dispersion

To 200 parts of a 4 wt % aqueous solution of polyvinyl alcohol were added 30 parts of the compound (II-1) of the present invention as the coupler and 10 parts of 1,2,3-triphenylguanidine as the organic base. The mixture was dispersed in a ball mill for 24 hours to prepare a dispersion. The dispersion had an average particle size of 1.2 μm.

Preparation of Coating Solution

The above capsule solution of the diazonium salt compound and the coupler dispersion were mixed in such a proportion as to provide a ratio by weight of the diazonium salt compound/coupler of 4/5, to thereby prepare the desired coating solution.

Coating

The coating solution was coated on a support for photographic paper (obtained by laminating polyethylene onto a good quality base paper) by wire bar coating. The coated product was dried to obtain Sample 101.

(ii) Preparation of Samples 102 to 106 (Invention)

Samples 102 to 106 were prepared in the same manner as Sample 101, except that an equimolar amount of each of the compounds of general formula (I) of the present invention shown in Table 1 below was used in place of the diazonium salt compound used in preparation of Sample 101.

Applied power to a thermal head and pulse duration were set so that the recording energy per unit area was 35 mJ/mm$^2$, and writing was made on each of the thus obtained Samples 101 to 106 using a thermal head (KST type, a product of Kyocera K.K.). The recording materials were fixed using an ultraviolet lamp (light emitting central wavelength: 420 nm; output: 40 W).

Fastness of image to light was tested. Comparative testing was conducted by irradiation with a fluorescent light at an illumination of 32,000 lux for 16 hours. The change in color density upon irradiation was measured using a Macbeth reflection densitometer (manufactured by Macbeth).

The results obtained are shown in Table 1 below.

TABLE 1

| | | Color Density | | | |
|---|---|---|---|---|---|
| | | Before Irradiation with Light | | After Irradiation with Light | |
| | diazonium Compound | Image Area | Area | Image Area | Area |
| Sample 101 (Comp. Ex.) | (III-1) | 1.64 | (0.12) | 1.45 | (0.16) |
| Sample 102 (Invention) | (I-1) | 1.55 | (0.11) | 1.53 | (0.12) |
| Sample 103 (Invention) | (I-2) | 1.53 | (0.12) | 1.50 | (0.13) |
| Sample 104 (Invention) | (I-4) | 1.51 | (0.11) | 1.48 | (0.12) |
| Sample 105 (Invention) | (I-5) | 1.50 | (0.12) | 1.47 | (0.12) |
| Sample 106 (Invention) | (I-8) | 1.54 | (0.11) | 1.50 | (0.12) |

It is apparent from the results obtained above that the samples of the present invention have excellent image fastness to light and reduced background staining.

(5) Preparation of Heat-Sensitive Recording Material (II)

(i) Preparation of Sample 201

Sample 201 was prepared in the same manner as Sample 101, except that an equimolar amount of a mixture of compounds (I-1) and (III-1) of the present invention in a ratio by weight shown in Table 2 below was used in place of the diazonium salt compound (2,5-dibutoxy-4-tolylthiobenzenediazonium hexafluorophosphate (III-1)) used in Sample 101. Writing was conducted on these samples obtained and image fastness to light was tested in the same manner as in Sample 101.

The results obtained are shown in Table 2 below.

TABLE 2

| | | | Color Density | | | |
|---|---|---|---|---|---|---|
| | | | Before Irradiation with Light | | After Irradiation with Light | |
| | diazonium Compound | Mixing Ratio | Image Area | Area | Image Area | Area |
| Sample 101 (Comp. Ex.) | III-1 | — | 1.64 | (0.12) | 1.45 | (0.16) |
| Sample 102 (Comp. Ex.) | I-1 | — | 1.55 | (0.11) | 1.53 | (0.12) |
| Sample 201 (Invention) | I-1/ III-1 | 4/1 | 1.62 | (0.11) | 1.59 | (0.12) |

It is apparent from the results obtained above that when the compounds of formulae (I) and (III) of the present invention are used in combination, background staining is reduced without lowering color density.

(6) Preparation of Heat-Sensitive Recording Material (III)

(i) Preparation of Sample 301

Preparation of Coating Solution for the First Heat-Sensitive Recording Layer (Preparation of Capsule Solution of Electron Donating Dye Precursor)

There was dissolved 3.0 parts of Crystal Violet lactone as the electron donating dye precursor in 20 parts of ethyl acetate. Furthermore, 20 parts of an alkylnaphthalene (high-boiling solvent) was added thereto, and the mixture was uniformly mixed with heating.

Furthermore, 20 parts of an adduct of xylylene diisocyanate/trimethylolpropane as the material for the capsule shell was added thereto, and the mixture was uniformly stirred.

Separately, 54 parts of a 6 wt % aqueous solution of polyvinyl alcohol (degree of polymerization: 1,700; degree of saponification: 88%) was prepared and added to the above electron donating dye precursor solution, and the mixture was emulsified and dispersed in a homogenizer.

To the resulting emulsion was added 68 parts of water, and the mixture was uniformly mixed. The temperature of the mixture was raised to 50° C. with stirring, and an encapsulization reaction was carried out for 3 hours to obtain the desired capsule solution. The resulting capsules had an average particle size of 1.6 μm.

(Preparation of Dispersion of Electron Accepting Compound)

To 150 parts of a 4 wt % aqueous solution of polyvinyl alcohol was added 30 parts of bisphenol A as the electron accepting compound. The mixture was dispersed in a ball mill for 24 hours to prepare a dispersion. The electron accepting compound in the dispersion had an average particle size of 1.2 μm.

(Preparation of Coating Solution)

The capsule solution of the electron donating dye precursor and the dispersion of the electron accepting compound were mixed in such a proportion as to provide a ratio by weight of the electron donating dye precursor/electron accepting compound of ½, to thereby obtain the desired coating solution.

Preparation of the Second Heat-Sensitive Recording (Preparation of Capsule Solution of Diazonium Salt Compound)

There was dissolved 2.0 parts of 4-{N-[2-(2,4-di-tert-amylphenoxy)butyryl]piperazino}benzenediazonium hexafluorophosphate as the diazonium compound in 20 parts of ethyl acetate. Furthermore, 20 parts of a lower-alkylnaphthalene (high-boiling solvent) was added thereto, and the mixture was uniformly mixed with heating.

To the resulting solution was added-15 parts of an adduct of xylylene diisocyanate/trimethylolpropane as the material for the capsule shell, and the mixture was uniformly stirred.

Separately, 54 parts of a 6 wt % aqueous solution of polyvinyl alcohol (degree of polymerization: 1,700; degree of saponification: 88%) was prepared and added to the above diazonium salt compound solution, and the mixture was emulsified and dispersed in a homogenizer.

To the resulting emulsion was added 68 parts of water, and the mixture was uniformly mixed. The temperature of the mixture was raised to 40° C. with stirring, and an encapsulization reaction was carried out for 3 hours to obtain the desired capsule solution. The resulting capsule particles had an average particle size of 1.1 μm.

(Preparation of Coupler Dispersion)

To 150 parts of a 4 wt % of polyvinyl alcohol was added 30 parts of 1-(2'-octylphenyl)-3-methyl-5-pyrazolone as a coupler, and the mixture was dispersed in a ball mill for 24 hours to prepare a dispersion. The coupler in the dispersion had an average particle size of 1.2 μm.

(Preparation of Coating Solution)

The capsule solution of the diazonium salt compound and the coupler dispersion were mixed in such a proportion as to provide a ratio by weight of the diazonium salt compound/the coupler of 2/3, to thereby obtain the desired coating solution.

Preparation of Coating Solution for Third Heat-Sensitive Recording layer (Preparation of Capsule Solution of Diazonium Salt Compound)

There was dissolved 3.0 parts of 2,5-dibutoxy-4-tolylthiobenzenediazonium hexafluorophosphate (III-1) in 20 parts of ethyl acetate. Furthermore, 20 parts of a lower-alkylnaphthalene (high-boiling solvent) was added thereto, and the mixture was uniformly mixed with heating.

To the resulting solution was added 15 parts of an adduct of xylylene diisocyanate/trimethylolpropane as the material for the capsule shell, and the mixture was uniformly stirred.

Separately, 54 parts of a 6 wt % aqueous solution of polyvinyl alcohol (degree of polymerization: 1,700; degree of saponification: 88%) was prepared, and the above diazonium salt compound solution was added thereto. The mixture was emulsified and dispersed in a homogenizer.

To the resulting emulsion was added-68 parts of water. The temperature of the mixture was raised to 40° C. with stirring, and an encapsulization reaction was carried out for 3 hours to obtain the desired capsule solution. The resulting capsule particles had an average particle size of 1.0 μm.

(Preparation of Coupler Dispersion)

To 200 parts of a 4 wt % aqueous solution of polyvinyl alcohol were added 30 parts of compound (II-2) of the present invention as the coupler and 10 parts of 1,2,3-triphenylguanidine as the organic base. The mixture was dispersed in a ball mill for 24 hours to prepare a dispersion. The particles in the dispersion had an average particle size of 1.2 μm.

(Preparation of Coating Solution)

The capsule solution of the diazonium salt compound and the coupler dispersion were mixed in such a proportion as to provide a ratio by weight of the diazonium salt compound/coupler of 4/5, to thereby prepare the desired coating solution.

(Coating)

The coating solution for the first heat-sensitive recording layer, the coating solution for the second heat-sensitive recording layer and the coating solution for the third heat-sensitive recording layer in this order were coated on a support (obtained by laminating polyethylene onto a good quality base paper) for photographic paper by wire bar coating. The coated support was dried to obtain a multi-color heat-sensitive recording material. The coating weights on a solid basis were 5.2 g, 6.3 g and 6.8 g, respectively.

(ii) Preparation of Sample 302

Sample 302 was prepared in the same manner as Sample 301 except that an equimolar amount of a mixture of compounds (I-1) and (III-1) of the present invention (in the same ratio by weight as that used in the Sample 201) was used in place of the diazonium salt compound (III-1) used in the third heat-sensitive recording layer of Sample 301.

(Thermal Recording of Samples 301 and 302)

Applied power to thermal head and pulse duration were set so that the recording energy per area was 35 $mJ/mm^2$. The writing (I) of the heat-sensitive recording material was conducted using a thermal head (KST type, a product of Kyocera K.K.).

Subsequently, the recording material was exposed to an ultraviolet lamp (light emitting central wavelength: 420 nm; output: 40 W) for 10 seconds. Applied power to the thermal head and pulse duration were again set so that recording energy per unit area was 62 $mJ/mm^2$, and writing (III) of the heat-sensitive recording material was conducted under these conditions.

Furthermore, the recording material was exposed to an ultraviolet lamp (light emitting central wavelength: 365 nm; output: 40 W) for 15 seconds. Applied power to the thermal head and pulse duration were again set so that the recording energy per unit area was 86 $mJ/mm^2$, and writing (III) of the heat-sensitive recording material was conducted under these conditions.

The recorded images on Sample 301 as well as on Sample 302 were such that a yellow colored image was formed on the area subjected to recording (I) only; a magenta colored image was formed on the area subjected to recording (II) only; and a blue colored image was formed on the area subjected to recording (III) only. Furthermore, a red colored image was formed on the area subjected to multi-recording of (I) and (II); a bluish green colored image was formed on the area subjected to multi-recording of (II) and (III); and a purple colored image was formed on the area subjected to multi-recording of (I) and (III). A nearly black image was formed on the area subjected to multi-recording of (I), (II) and (III).

Fastness of image to light was tested. The samples subjected to recording (I) only were irradiated with light at an illumination of 32,000 lux for 16 hours using a fluorescent lamp. The change in color density following irradiation was measured using a Macbeth reflection densitometer (a product of Macbeth).

The results obtained are shown in Table 3 below.

TABLE 3

| | | Color Density | | | |
|---|---|---|---|---|---|
| | | Before Irradiation with Light | | After Irradiation with Light | |
| | diazonium Compound | Image Area | Area | Image Area | Area |
| Sample 301 (Comp. Ex.) | III-1 | 1.67 | (0.12) | 1.44 | (0.16) |
| Sample 302 (Invention) | I-1/III-1 (4/1) | 1.65 | (0.11) | 1.62 | (0.12) |

It can be seen from the results obtained above that use of the diazonium salt compounds (I) and (III) and the coupler (II) of the present invention provides a preferred hue and a preferred color density in multi-color thermal recording, and that the present invention provides an image having excellent fastness to light and reduced background staining.

(8) Preparation of Heat-Sensitive Recording Material (IV)

(i) Preparation of Sample 401

Sample 401 was prepared in the same manner as Sample 101, except that an equimolar amount of a mixture of the diazonium salt compounds (IV-1) and (V-1) (4-(p-chlorophenylthio)-2,5-dibutoxybenzenediazonium hexafluorophosphate and 4-tolylthio-2,5-dibutoxybenzenediazonium hexafluorophosphate) in a ratio by weight shown in Table 4 below was used in place of the diazonium salt compound (III-1) used in Sample 101, and the coupler compound (VI-2) (2',5'-di-n-heptyloxy-2-acetoanilide was used in place of compound (II-1) used in Sample 101.

(ii) Preparation of Sample 402

Sample 402 was prepared in the same manner as Sample 401, except that the coupler compound (VI-3) (2',5'-[3-ethoxycarbonyl)propyloxy]-2-acetoanilide) was used in place of compound (VI-2).

(iii) Preparation of Sample 403

Sample 403 was prepared in the same manner as Sample 401, except that the diazonium salt compound (IV-4) (4-(p-chlorophenylthio)-2,5-di-n-pentyloxybenzenediazonium hexafluorophosphate) was used in place of compound (IV-1).

(iv) Preparation of Sample 404 (Comparison)

Sample 404 was prepared in the same manner as Sample 101, except that the diazonium salt compound (IV-1) (4-(p-chlorophenylthio)-2,5-dibutoxybenzenediazonium hexafluorophosphate) was used in place of compound (III-1) used in Sample 101, and the coupler compound (VI-2) was used in place of compound (II-1) used in Sample 101.

(v) Preparation of Sample 405 (comparison)

Sample 405 was prepared in the same manner as Sample 401, except that the diazonium salt compound (I-8) (4-(p-methoxycarbonylphenylthio)-2,5-dibutoxybenzenediazonium hexafluorophosphate) was used in place of compound (IV-1).

(vi) Preparation of Sample 406 (Comparison)

Sample 406 was prepared in the same manner as Sample 401, except that the coupler compound (II-1) (4,4-dimethyl-3-oxopentanoic acid-2',5'-di-n-butoxy-4'-chloroanilide) was used in place of compound (VI-2).

Writing was conducted on these samples obtained and image fastness to light was tested in the same manner as in Sample 101.

The results obtained are shown in Table 4 below.

TABLE 4

| | | | Color Density | | | |
|---|---|---|---|---|---|---|
| | diazonium | | Before Irradiation with Light | | After Irradiation with Light | |
| | Compound | Mixing Ratio | Image Area | Area | Image Area | Area |
| Sample 401 (Comp. Ex.) | IV-1/ V-1 | 4/1 | 1.72 | (0.11) | 1.71 | (0.11) |
| Sample 402 (Comp. Ex.) | IV-1/ V-1 | 4/1 | 1.70 | (0.11) | 1.68 | (0.11) |
| Sample 403 (Invention) | IV-4/ V-1 | 4/1 | 1.73 | (0.11) | 1.72 | (0.11) |
| Sample 404 (Comp. Ex.) | IV-1 | — | 1.50 | (0.11) | 1.49 | (0.12) |
| Sample 405 (Comp. Ex.) | I-8/ V-1 | 4/1 | 1.61 | (0.11) | 1.58 | (0.12) |
| Sample 406 (Invention) | IV-1/ V-1 | 4/1 | 1.62 | (0.11) | 1.59 | (0.12) |

It can be seen from the results obtained above that the combination use of the diazonium compounds represented by general formulae (IV) and (V) and the coupler compound represented by general formula (VI) provides excellent fastness to light and color density in multi-color thermal recording.

While the invention has been described in detail and with reference to specific examples thereof, it will be apparent to one skilled in the art that various changes and modifications can be made therein without departing from the spirit and scope thereof.

What is claimed is:

1. A multi-color heat-sensitive recording material comprising a support having laminated thereon in the following order a first heat-sensitive color forming layer comprising mainly an electron donating dye precursor and an electron accepting compound, a second heat-sensitive color forming layer containing a first diazonium salt compound having a maximum absorption wavelength of 360±20 nm and a first coupler capable of reacting with the first diazonium salt compound by heating to form color and a third heat-sensitive color forming layer containing a second diazonium salt compound in an amount from 0.02 to 3 $g/m^2$ of the recording material represented by the following general formula (I) having a maximum absorption wavelength of 400±20 nm and a second coupler in an amount from 0.05 to 5 $g/m^2$ of the recording material represented by the following general formula (II) capable of reacting with the second diazonium salt compound by heating to form a color:

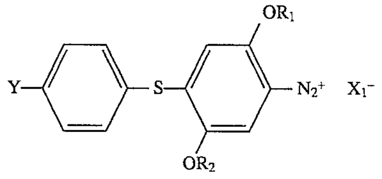

(I)

wherein $R_1$ and $R_2$, which may be the same or different, each represents an alkyl group, an aralkyl group or an aryl group, wherein $R_1$ and $R_2$ by be substituted with an alkyl group, an aryl group, a hydroxy group, an alkoxy group, an aryloxy group, an alkylthio group, an arylthio group, an acyl group, an alkoxycarbonyl group, an acyloxy group, a carbamoyl group, an acylamino group, a cyano group or a halogen atom; Y represents a halogen atom, an acyl group, an alkoxycarbonyl group or a sulfamoyl group; and $X_1^-$ represents a counter anion;

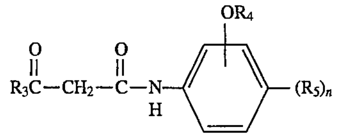

(II)

wherein $R_3$ represents an alkyl group or an aryl group; $R_4$ wherein $R_3$ represents an alkyl group or an aryl group; $R_4$ represents an alkyl group, an aryl group or an aralkyl group; $R_5$ represents an alkyl group, an alkoxy group, an aryloxy group, an aralkyloxy group, an alkylthio group, an arylthio group, an aralkylthio group or a halogen atom; wherein $R_3$, $R_4$ and $R_5$ may be substituted with an alkyl group, an aryl group, an alkoxy group, a cyano group, an ester group, an amide group, or a halogen atom; n represents 0 or an integer of 1 to 4, and when n is 2 or greater, the two or more $R_5$ groups may be the same or different; and the sum total of carbon atoms in $R_4$ and $(R_5)_n$ is at least 5.

2. The multi-color heat-sensitive recording material as in claim 1, wherein the third heat-sensitive color forming layer further contains a diazonium salt compound represented by the following general formula (III):

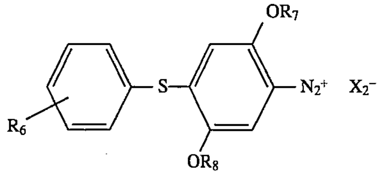

(III)

wherein $R_6$, $R_7$ and $R_8$, which may be the same or different, each represents an alkyl group, an aralkyl group or an aryl group, wherein $R_6$, $R_7$ and $R_8$ may be substituted with an alkyl group, an aryl group, a hydroxy group, an alkoxy group, an aryloxy group, an alkythio group, an arylthio group, an acyl group, an alkoxycarbonyl group, an acyloxy group, a carbamoyl group, an acylamino group, a cyano group, or a halogen atom; and $X_2^-$ represents a counter anion.

3. The multi-color heat-sensitive recording material as in claim 2, wherein the second diazonium salt compound represented by general formula (I) is a compound represented by the following general formula (IV), the diazonium salt compound represented by general formula (III) is a compound represented by the following general formula (V), and the second coupler represented by general formula (II) is a compound represented by the following general formula (VI):

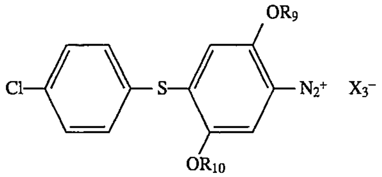

(IV)

wherein $R_9$ and $R_{10}$, which may be the same or different, each represents alkyl group that may be substituted with an aryl group, an alkoxy group, a cyano group, an ester group, an amide group, or a halogen atom; and $X_3^-$ represents a counter anion:

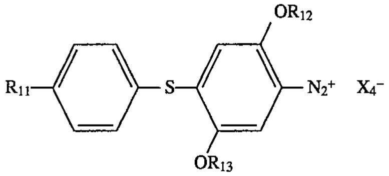

(V)

wherein $R_{11}$, $R_{12}$ and $R_{13}$, which may be the same or different, each represents an alkyl group that may be substituted with an aryl group, an alkoxy group, a cyano group, an ester group, an amide group, or a halogen atom; and $X_4^-$ represents a counter anion:

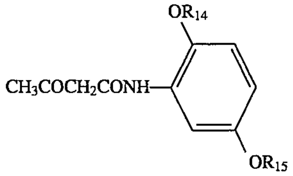

(VI)

wherein $R_{14}$ and $R_{15}$, which may be the same or different, each represent an alkyl group that may be substituted with an aryl group, a hydroxy group, an alkoxy group, an aryloxy group, an alkylthio group, an arylthio group, an acyl group, an alkoxycarbonyl group, an acyloxy group, a carbamoyl group, an acylamino group, a cyano group, or a halogen atom.

4. The multi-color heat-sensitive recording material as in claim 2, wherein the third heat-sensitive color forming layer contains a diazonium salt compound represented by general formula (I) in an amount of form 0.02 to 3 $g/m^2$ of the recording materials and a diazonium salt compound represented by general formula (III) in an amount of form 1 to 70 wt % of the compound of general formula (I).

* * * * *